US011860192B2

(12) United States Patent
Ahn et al.

(10) Patent No.: US 11,860,192 B2
(45) Date of Patent: *Jan. 2, 2024

(54) PROBE HEAD AND PROBE CARD HAVING SAME

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/161,460

(22) Filed: Jan. 28, 2021

(65) Prior Publication Data

US 2021/0239735 A1 Aug. 5, 2021

(30) Foreign Application Priority Data

Jan. 31, 2020 (KR) ........................ 10-2020-0011850

(51) Int. Cl.
 *G01R 1/073* (2006.01)
(52) U.S. Cl.
 CPC ................. *G01R 1/07314* (2013.01)
(58) Field of Classification Search
 CPC .................................................. G01R 1/07314
 See application file for complete search history.

(56) References Cited

U.S. PATENT DOCUMENTS

| | | | | |
|---|---|---|---|---|
| 4,774,459 A * | 9/1988 | Maelzer | ............. | G01R 1/07371 324/750.25 |
| 4,901,013 A * | 2/1990 | Benedetto | .......... | G01R 1/07357 324/755.06 |
| 11,691,387 B2 * | 7/2023 | Ahn | ........................ | B32B 27/38 324/755.01 |
| 11,696,398 B2 * | 7/2023 | Ahn | .................... | G01R 1/07371 324/754.18 |
| 2011/0043239 A1 * | 2/2011 | Tomita | ............... | H01R 13/2414 324/756.03 |
| 2011/0095419 A1 * | 4/2011 | Horiuchi | ............... | H01L 21/486 427/97.8 |

(Continued)

FOREIGN PATENT DOCUMENTS

| | | |
|---|---|---|
| CN | 107580681 A | 1/2018 |
| EP | 0308129 A1 * | 3/1989 |

(Continued)

OTHER PUBLICATIONS

KR 2020 0048271 A by Ahn et al. (Year: 2020).*
English Translation of KR 10-2017-0139321 (Year: 2017).*

*Primary Examiner* — Paresh Patel (57) ABSTRACT

Proposed are a probe head and a probe card having the same. According to the present disclosure, the probe head of the probe card includes: an upper guide plate having an upper guide hole; a lower guide plate having a lower guide hole; and an intermediate guide plate having an intermediate guide hole and provided between the upper guide plate and the lower guide plate, wherein each of a plurality of probes sequentially passes through the upper guide hole, the intermediate guide hole, and the lower guide hole, and the intermediate guide plate is made of an anodic oxide film.

8 Claims, 8 Drawing Sheets

(56) References Cited

U.S. PATENT DOCUMENTS

| | | | |
|---|---|---|---|
| 2018/0299489 A1 | 10/2018 | Yoshioka | |
| 2019/0076854 A1* | 3/2019 | Ahn | ................ C23C 16/45559 |
| 2020/0025797 A1 | 1/2020 | Nasu | |
| 2021/0199696 A1* | 7/2021 | Ahn | ................ G01R 1/07342 |
| 2021/0238763 A1* | 8/2021 | Ahn | ...................... B32B 3/266 |

FOREIGN PATENT DOCUMENTS

| | | | |
|---|---|---|---|
| JP | 2004235591 A | * | 8/2004 |
| KR | 10-1719912 B1 | | 3/2017 |
| TW | 201734464 A | | 10/2017 |
| TW | 201821806 A | | 6/2018 |

* cited by examiner

PROBE HEAD AND PROBE CARD HAVING SAME

CROSS REFERENCE TO RELATED APPLICATION

The present application claims priority to Korean Patent Application No. 10-2020-0011850, filed Jan. 31, 2020, the entire contents of which is incorporated herein for all purposes by this reference.

BACKGROUND OF THE INVENTION

Field of the Invention

The present disclosure relates generally to a probe head and a probe card having the same and, more particularly, to a probe head that facilitates formation of a guide hole for allowing passage of a probe, and to a probe card having the same.

Description of the Related Art

In general, a semiconductor manufacturing process largely includes a fabrication process for forming a pattern on a wafer, an electrical die sorting (EDS) process for testing electrical characteristics of respective chips constituting the wafer, and an assembly process for assembling the wafer on which a pattern is formed to individual chips.

Here, the EDS process is performed to detect defective chips among the chips constituting the wafer. In the EDS process, a probe card which applies electrical signals to the chips constituting the wafer and determines whether the chips are defective on the basis of signals checked from the applied electrical signals is mainly used.

A probe card is a device that connects a semiconductor wafer (or a semiconductor device) and test equipment to test the operation of the semiconductor device, and serves to transmit electricity while connecting probes provided on the probe card to a wafer, and then sort defective semiconductor chips on the basis of feedback signals received thereby.

The probe card used for an electrical test of the semiconductor device may include a circuit board, an interposer, a space transformer, a probe head, and probes. In the probe card, an electrical path is provided through the circuit board, the interposer, the space transformer, and the probe head, and a pattern of a wafer is tested by the probes that directly contact the wafer.

The probe head supports the probe passing through the space transformer, and serves to prevent an electrical short due to contact between adjacent probes. Specifically, the probe head includes at least one guide plate, and the probes are inserted into a guide hole formed in the guide plate and guided toward the wafer.

An example of such a guide plate for a probe card disclosed in Korean Patent No. 10-1719912 (hereinafter referred to as "related art").

In a ceramic guide plate for a probe card of the related art, a plurality of green sheets are stacked and pressed to form a green bar, and one surface of the green bar is irradiated with laser light to form through-holes into which probes are inserted.

However, the ceramic guide plate of ceramic material as described above has a low transmittance and thus is problematic in that it may be difficult to insert the probes, and due thereto, a manufacturing time and manufacturing cost of the probe card may increase.

Furthermore, each of the through-holes formed through the irradiation of the laser light has a large opening area on a surface irradiated with the laser light, so that the through-hole is not vertically formed but has an inclined hole shape with a large area on either of an upper portion or a lower portion. Accordingly, when the probes come into contact with a semiconductor wafer (or a semiconductor device), the probes may be shaken to cause a change in the position of the probes, which may lead to a reduction in reliability of the probe card.

Furthermore, thermal deformation of the green bar may occur due to heat generated upon the irradiation of the laser light, which may cause a problem in that a plurality of through-holes cannot be precisely formed.

Moreover, the irradiation of the laser light takes a lot of time and is very costly, and thus, there is a problem in that the manufacturing time and the manufacturing cost of the probe card may increase.

The foregoing is intended merely to aid in the understanding of the background of the present disclosure, and is not intended to mean that the present disclosure falls within the purview of the related art that is already known to those skilled in the art.

DOCUMENTS OF RELATED ART (Patent document 1) Korean Patent No. 10-1719912

SUMMARY OF THE INVENTION

Accordingly, the present disclosure has been made keeping in mind the above problems occurring in the related art, and an objective of the present disclosure is to provide a probe head that facilitates formation of a guide hole for allowing passage of a probe, and to provide a probe card having the same.

Another objective of the present disclosure is to provide a probe head that facilitates insertion of a probe, and to provide a probe card having the same.

In order to achieve the above objectives, according to one aspect of the present disclosure, there is provided a probe head of a probe card, the probe head including: an upper guide plate having an upper guide hole; a lower guide plate having a lower guide hole; and an intermediate guide plate having an intermediate guide hole and provided between the upper guide plate and the lower guide plate, wherein each of a plurality of probes sequentially may pass through the upper guide hole, the intermediate guide hole, and the lower guide hole, and the intermediate guide plate may be made of an anodic oxide film.

Furthermore, a film may be provided on or under the intermediate guide plate, and the film may include the same hole as the upper guide hole, the lower guide hole, and the intermediate guide hole.

Furthermore, the film may be a photosensitive film capable of lithography.

Furthermore, the intermediate guide plate may be configured by stacking a plurality of unit anodic oxide film sheets.

Furthermore, the stacked unit anodic oxide film sheets of the intermediate guide plate may be bonded to each other by the film.

Furthermore, at least one of upper and lower surfaces of the intermediate guide plate may be composed of a barrier layer that closes one ends of orderly arranged pores formed by anodizing a metal.

According to another aspect of the present disclosure, there is provided a probe card, including: a space transformer having a probe connection pad electrically connected to each of a plurality of probes; and a probe head provided below the space transformer, wherein the probe head may include: an upper guide plate having an upper guide hole; a lower guide plate having a lower guide hole; and an intermediate guide plate provided between the upper guide plate and the lower guide plate, and made of an anodic oxide film.

As described above, in the probe head and the probe card having the same according to the present disclosure, it is possible to facilitate formation of the guide holes for allowing passage of the probes.

In addition, it is possible to facilitate insertion of the probes.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Contents of the description below merely exemplify the principle of the present disclosure. Therefore, those of ordinary skill in the art may implement the theory of the present disclosure and invent various apparatuses which are included within the concept and the scope of the present disclosure even though it is not clearly explained or illustrated in the description. Furthermore, in principle, all the conditional terms and embodiments listed in this description are clearly intended for the purpose of understanding the concept of the present disclosure, and one should understand that this present disclosure is not limited the exemplary embodiments and the conditions.

The above described objectives, features, and advantages will be more apparent through the following detailed description related to the accompanying drawings, and thus those of ordinary skill in the art may easily implement the technical spirit of the present disclosure.

The embodiments of the present disclosure will be described with reference to cross-sectional views and/or perspective views which schematically illustrate ideal embodiments of the present disclosure. For explicit and convenient description of the technical content, thicknesses and widths of members and regions in the figures may be exaggerated. Therefore, variations from the shapes of the illustrations as a result, for example, of manufacturing techniques and/or tolerances, are to be expected.

In addition, a limited number of holes are illustrated in the drawings. Thus, the embodiments should not be construed as limited to the particular shapes of regions illustrated herein but are to include deviations in shapes that result, for example, from manufacturing.

In describing various embodiments, the same reference numerals will be used throughout different embodiments and the description to refer to the same or like elements or parts. In addition, the configuration and operation already described in other embodiments will be omitted for convenience.

Hereinafter, exemplary embodiments of the present disclosure will be described in detail with reference to the accompanying drawings.

Figure 1:
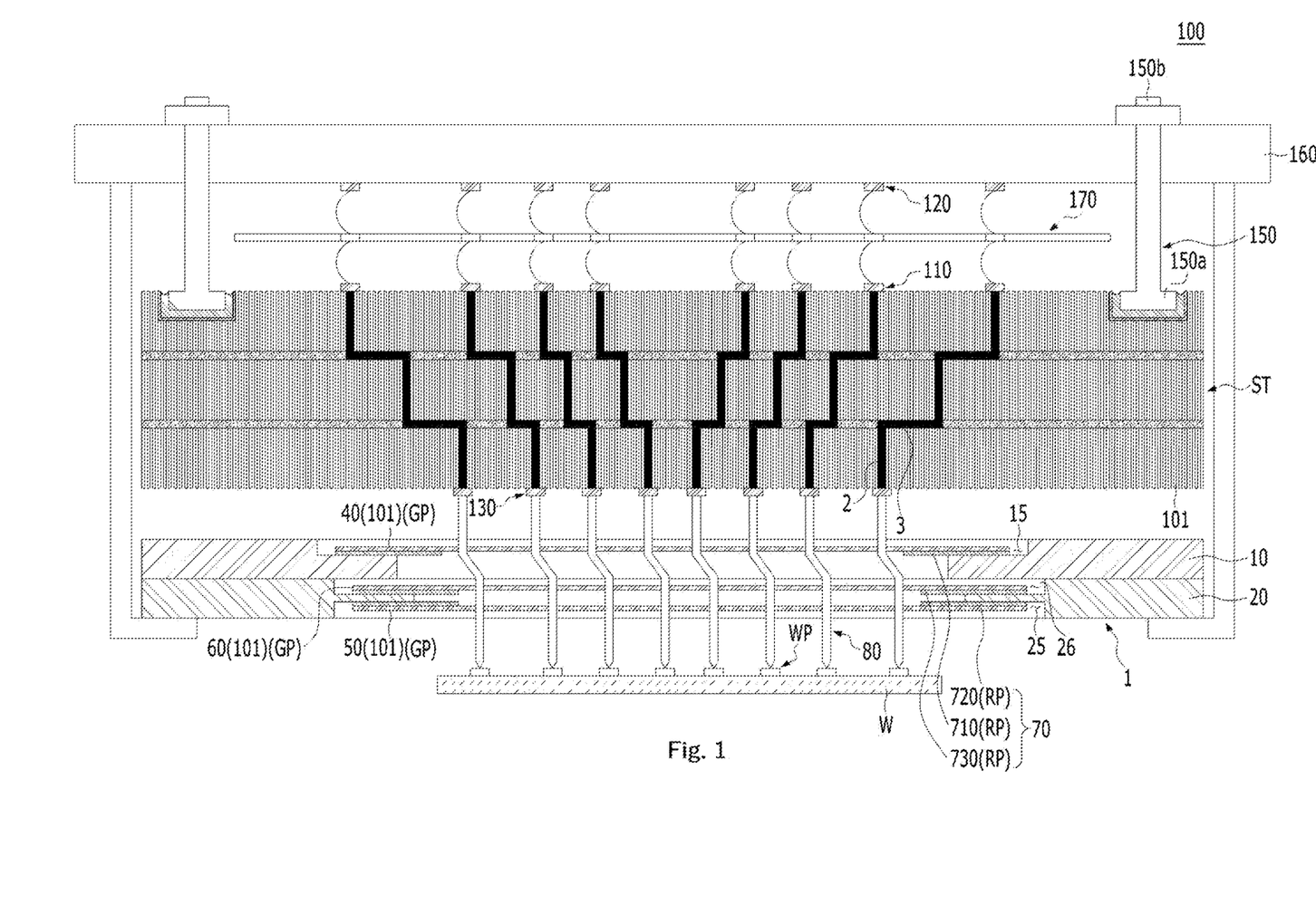
FIG. 1 is a view schematically illustrating a probe card according to an embodiment of the present disclosure.

FIG. 1 is a view schematically illustrating a probe card 100 according to an embodiment of the present disclosure. In this figure, for convenience of description, the number and size of a plurality of probes 80 are illustrated exaggeratedly.

Depending on the structure of installing the probes 80 on a space transformer ST and the structure of the probes 80, the probe card 100 may be divided into a vertical type probe card, a cantilever type probe card, a micro-electro-mechanical system (MEMS) probe card 100. In the present disclosure, as an example, a vertical type probe card 100 is illustrated to describe a coupling structure between the space transformer ST and other peripheral parts. The type of the probe card in which the coupling structure between the space transformer ST of the present disclosure and other peripheral parts is implemented is not limited thereto, and may be the MEMS probe card and the cantilever type probe card.

FIG. 1 illustrates a contact state of electrode pads WP of a wafer W. A test for electrical characteristics of semiconductor devices is performed by approaching the wafer W to the probe card 100 having the plurality of probes 80 on a wiring board, and bring the respective probes 80 into contact with corresponding electrode pads WP on the wafer W. After the probes 80 reach positions where the probes 80 are brought into contact with the electrode pads WP, the wafer W may be further lifted by a predetermined height toward the probe card 100. This process may be overdrive.

As illustrated in FIG. 1, the probe card 100 according to the present disclosure may include the space transformer ST made of an anodic oxide film 101, and including a vertical wiring 2, a horizontal wiring 3 connected to the vertical wiring 2, and a probe connection pad 130 electrically connected to each of the plurality of probes 80; and a coupling member 150 having a first end 150a fixed to a surface of the space transformer ST and a second end 150b coupled to the circuit board 160 provided above the space transformer ST. In this case, the coupling member 150 may be configured as a bolt, but is not limited thereto.

As illustrated in FIG. 1, the circuit board 160 may be provided above the space transformer ST, and the probe head 1 on which the plurality of probes 80 are provided may be provided below the space transformer ST. In other words, the space transformer ST may be located between the circuit board 160 and the probe head 1. The space transformer ST may be coupled to peripheral parts by the coupling member 150.

With such a structure, the space transformer ST coupled to the circuit board 160 by the coupling member 150 may be electrically connected thereto by an interposer 170 interposed between the circuit board 160 and the space transformer ST. Specifically, a first interposer connection pad 110 may be provided on an upper surface of the space transformer ST, and a second interposer connection pad 120 may be provided on a lower surface of the circuit board 160.

Therefore, the interposer 170 interposed between the space transformer ST and the circuit board 160 may be joined to the first interposer connection pad 110 and the second interposer connection pad 120 to form an electrical connection between the space transformer ST and the circuit board 160.

The space transformer ST may be made of the anodic oxide film 101. The anodic oxide film 101 is a film formed by anodizing a metal that is a base material, and pores 101a are pores formed in the anodic oxide film 101 during the process of anodizing the metal to form the anodic oxide film 101. For example, in a case where the metal as the base material is aluminum (Al) or an aluminum alloy, the anodization of the base material forms the anodic oxide film 101 consisting of anodized aluminum ($Al_2O_3$) on a surface SF of the base material. The anodic oxide film 101 foiled as described above is divided into a barrier layer BL in which no pores 101a are formed and a porous layer PL in which pores 101a are formed. The barrier layer BL is positioned on the base material, and the porous layer PL is positioned on the barrier layer BL. In a state in which the anodic oxide film 101 having the barrier layer BL and the porous layer PL is formed on the surface SF of the base material, when the base material is removed, only the anodic oxide film 101 consisting of anodized aluminum ($Al_2O_3$) remains. The resulting anodic oxide film 101 has the pores 101a that have a uniform diameter, are formed in a vertical shape, and have a regular arrangement. In this case, when the barrier layer BL is removed, a structure in which the pores 101a vertically pass through the anodic oxide film 101 from top to bottom is formed.

The anodic oxide film 101 has a coefficient of thermal expansion of 2 to 3 ppm/° C. This may result in less deformation due to temperature.

According to the present disclosure, by configuring the space transformer ST using the anodic oxide film 101, the space transformer ST having less thermal deformation under a high temperature environment may be implemented.

The probe head 1 is provided below the space transformer ST. The probe head 1 may include: a guide plate GP including first and second plates 10 and 20 and upper, intermediate, and lower guide plates 40, 50, and 60; and a reinforcing plate RP including the plurality of probes 80 and upper, intermediate, and lower reinforcing plates 710, 720, and 730. The probe head 1 may be manufactured by means of bolt fastening as an example. However, since this is a coupling means described as an example, the coupling means is omitted in the drawings.

The probe head 1 supports the probes 80 and may have a structure in which the second plate 20 is provided under the first plate 10. Specifically, the first plate 10 may include an upper seating region 15 for having the upper guide plate 40 and the upper reinforcing plate 710 therein, and the second plate 20 may include a lower seating region 25 for having the lower guide plate 50 and the lower reinforcing plate 720 therein, and an intermediate seating region 26 for having the intermediate guide plate 60 and the intermediate reinforcing plate 730 therein.

The probes 80 may sequentially pass through the upper guide plate 40, the lower guide plate 50, and the intermediate guide plate 60 to be provided toward the wafer W. Hereinafter, the configuration of the probe head 1 according to the present disclosure will be described in detail with reference to FIGS. 2 and 3.

Figure 2:
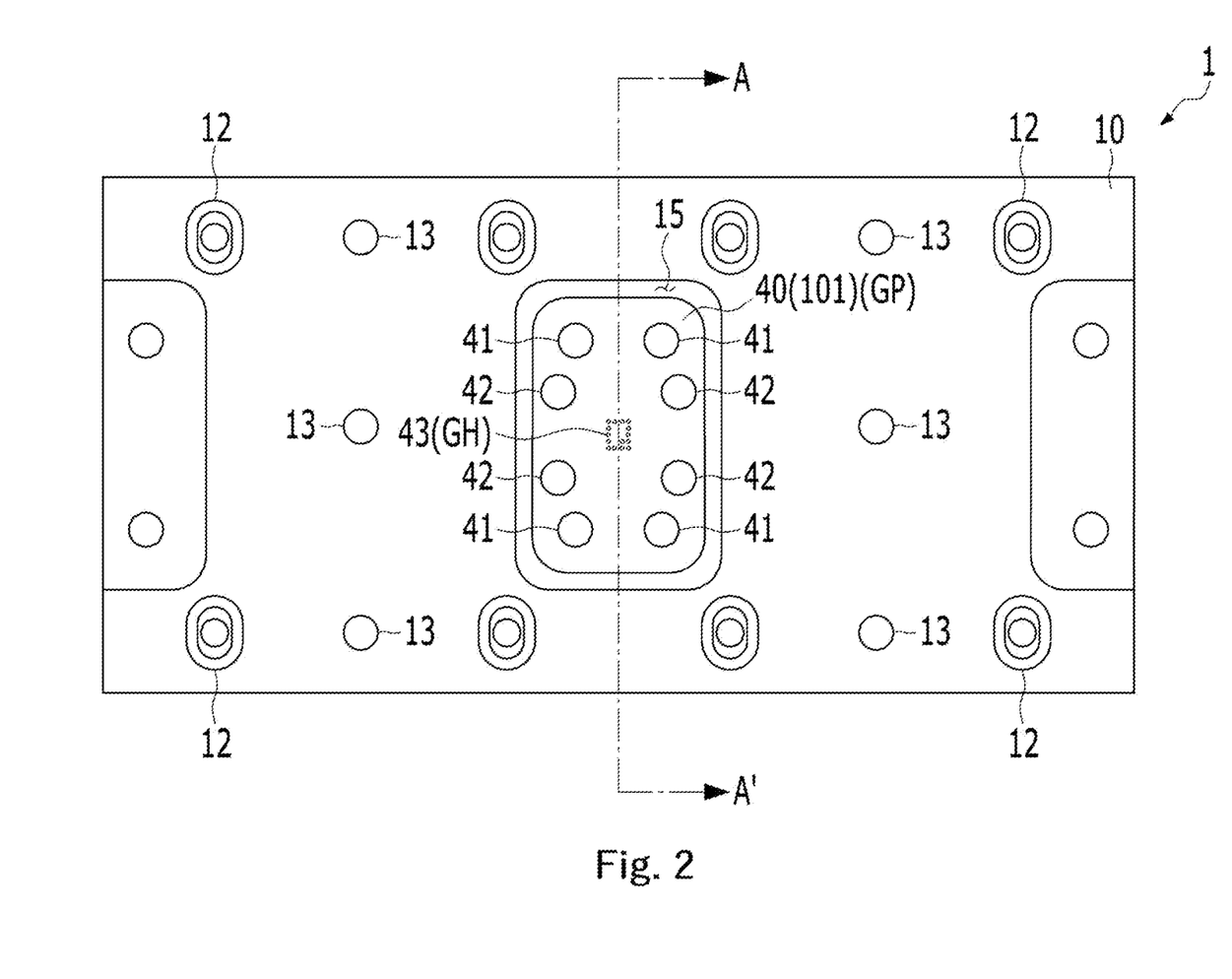
FIG. 2 is a top view of a probe head constituting the present disclosure.
Figure 3:
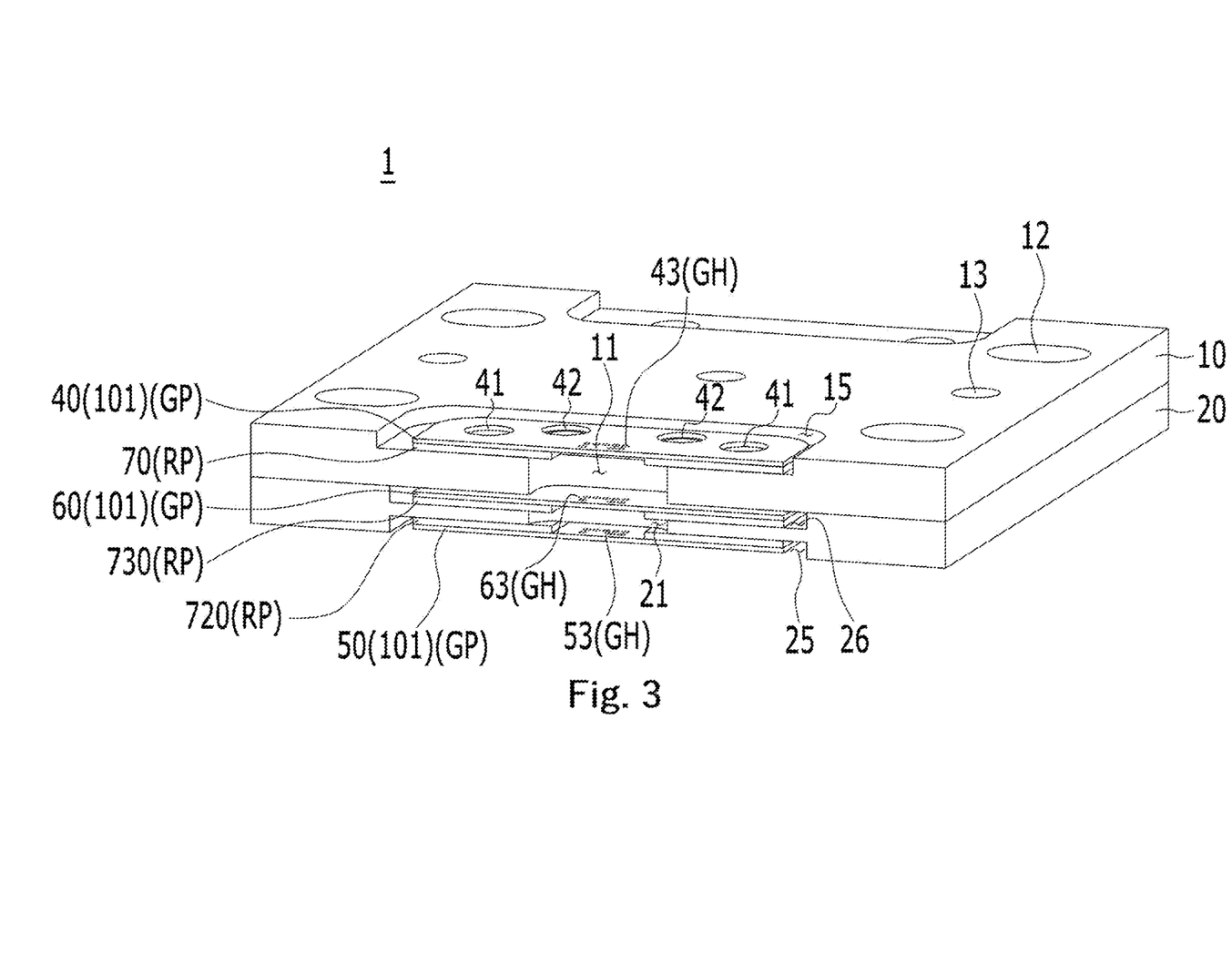
FIG. 3 is a perspective view when viewed from a surface cut along line A-A' of FIG. 2.

FIG. 2 is a top view of the probe head constituting the present disclosure, and FIG. 3 is a perspective view when viewed from a surface cut along line A-A' of FIG. 2.

As illustrated in FIGS. 2 and 3, the first plate 10 and the second plate 20 may be provided in corresponding shapes, and the second plate 20 may be provided under the first plate 10.

The first plate 10 may be provided with an upper coupling hole 12 and a first guide pin insertion hole 13. In addition, the second plate 20 may be provided with a lower coupling hole (not illustrated) and a second guide pin insertion hole (not illustrated) respectively corresponding to the sizes of the upper coupling hole 12 and the first guide pin insertion hole 13 at positions respectively corresponding to the upper coupling hole 12 and the first guide pin insertion hole 13.

A coupling means may be provided in the upper coupling hole 12 and the lower coupling hole, and a guide pin may be provided in the first guide pin insertion hole 13 and the second guide pin insertion hole. In this case, the coupling means denotes a means for coupling the first plate 10 and the second plate 20, and the guide pin denotes an auxiliary means for aligning the first plate 10 and the second plate 20. The coupling means may be configured as a bolt as an example.

Specifically, the guide pin may sequentially pass through the first guide pin insertion hole 13 and the second guide pin insertion hole to align the first plate 10 and the second plate 20, and then the coupling means may sequentially pass through the upper coupling hole 12 and the lower coupling hole to couple the first plate 10 and the second plate 20. In this case, the guide pin may be removed before the first and second plates 10 and 20 are coupled to each other by means of the bolt through the upper coupling hole 12 and the lower coupling hole.

The positions, shapes, and numbers of the upper coupling hole 12 and the first guide pin insertion hole 13 of the first plate 10 illustrated in FIGS. 2 and 3 are illustrated as an example, and thus the positions, shapes, and numbers thereof are not limited thereto.

The upper seating region 15 is formed on the first plate 10, and the lower seating region 25 and the intermediate seating region 26 are formed on the second plate 20. In this case, the upper seating region 15 may be formed on an upper side of the first plate 10, the intermediate seating region 26 may be formed on an upper side of the second plate 20, and the lower seating region 25 may be formed on a lower side of the second plate 20. In addition, the upper seating region 15, the lower seating region 25, and the intermediate seating region 26 may have the same size and shape.

After the first plate 10 and the second plate 20 are coupled to each other, the lower seating region 25 and the intermediate seating region 26 may be located on the same vertical line, but the upper seating region 15 may be located on a vertical line that is not the same as that of the lower seating region 25 and the intermediate seating region 26.

The first plate 10 and the second plate 20 are provided with a plurality of guide plates GP and reinforcing plates RP. Specifically, the guide plates GP and the reinforcing plates RP may be provided in the upper seating region 15, the lower seating region 25, and the intermediate seating region 26. Therefore, each of the guide plates GP and the reinforcing plates RP may be formed to have a size smaller than that of the upper seating region 15, the lower seating region 25, and the intermediate seating region 26.

The guide plates GP include the upper guide plate 40, the lower guide plate 50, and the intermediate guide plate 60. The upper guide plate, 40, the lower guide plate 50, and the intermediate guide plate 60 may be formed in shapes corresponding to each other, and may include the same configuration (e.g., a guide hole GH for allowing insertion of each of the plurality of probes 80).

With this structure, handling of the probe head 1 may be facilitated. Specifically, when ends of the plurality of probes 80 first inserted through the respective guide holes GH are front ends of the probes 80, the upper guide plate, 40, the lower guide plate 50, and the intermediate guide plate 60 may serve to guide the front ends of the probes 80. In other words, the upper guide plate, 40, the lower guide plate 50, and the intermediate guide plate 60 may define probing areas of the probe card 100. Therefore, on the first and second plates 10 and 20 defining the entire area of the probe head 1, the areas 50, occupied by the upper guide plate, 40, the lower guide plate and the intermediate guide plate 60 may be the probing areas.

Since the upper guide plate, 40, the lower guide plate 50, and the intermediate guide plate 60 may have smaller areas than the first and second plates 10 and 20, a problem in which the probing areas are broken or damaged may be minimized. Therefore, handling of the probe card 100 may be facilitated.

Unlike the probe head 1 constituting the present disclosure, when the upper guide plate 40, the lower guide plate 50, and the intermediate guide plate 60 defining the probing areas define the entire area of the probe head 1, an unnecessary area other than the probing areas in which the plurality of probes 80 are provided and performing a practical probing process may be included in the probing areas thereby defining the entire area of the probe head 1.

This structure may cause a problem in that handling is difficult because even if a portion of the probe head 1 is damaged, this means that the probing areas are damaged. However, in the probe head 1 constituting the present disclosure, since the upper guide plate 40, the lower guide plate 50, and the intermediate guide plate 60 defining the probing areas may have smaller areas than the first and second plates 10 and 20 defining the entire area of the probe head 1, the risk of damage may be lowered and handling may be facilitated.

In addition, in the probe head 1 constituting the present disclosure, since the upper guide plate 40, the lower guide plate 50, and the intermediate guide plate 60 defining the probing areas may have smaller areas than the first and second plates 10 and 20 defining the entire area of the probe head 1, a relatively uniform flatness may be achieved compared to a structure in which the upper guide plate 40, the lower guide plate 50, and the intermediate guide plate 60 define the entire area of the probe head 1.

When the upper guide plate 40, the lower guide plate 50, and the intermediate guide plate 60 define the entire area of the probe head 1, it is difficult to achieve uniform flatness due to a large area thereof. When the flatness of the upper guide plate 40, the lower guide plate 50, and the intermediate guide plate 60 each having the guide hole GH into which the probes 80 are inserted is not uniform, the positions of the probes 80 may be changed, resulting in an error in wafer pattern test. However, in the probe head 1 constituting the present disclosure, since the upper guide plate 40, the lower guide plate 50, and the intermediate guide plate 60 in which the probes 80 are inserted may have smaller areas than the probe head 1, it may be advantageous to achieve uniform flatness thereof.

The first plate 10 constituting the probe head 1 may serve to support, on an upper surface thereof, the upper guide plate 40 that serves to guide the front ends of the probes 80. The first plate 10 may have a larger area than the upper guide plate 40 and may support the upper guide plate 40 in at least a partial area of the upper surface thereof.

The first plate 10 may include the upper seating region 15 for seating the upper guide plate 40 therein. The upper seating region 15 may be configured as a concave recess in the upper surface of the first plate 10. However, since the concave recess shape of the upper seating region 15 is illustrated as an example, the shape thereof is not limited thereto. Therefore, the upper seating region 15 may be formed in a suitable shape to allow the upper guide plate 40 to be provided on the upper surface of the first plate 10 more stably.

The first plate 10 may include a first through-hole 11. The first through-hole 11 may be provided to allow the plurality of probes 80 inserted through an upper guide hole 43 of the upper guide plate 40 to be positioned therein. Therefore, the first through-hole 11 may be formed at a position corresponding to a position where the upper guide hole 43 of the upper guide plate 40 is formed, to allow the plurality of probes 80 to be positioned therein, and in consideration of the elastic deformation of the plurality of probes 80, may have an inner diameter capable of receiving the elastic deformation.

The second plate 20 may be coupled to a lower portion of the first plate 10. The second plate 20 may serve to support, on a lower surface thereof, the lower guide plate 50 and the intermediate guide plate 60 that serve to guide the front ends of the probes 80. Specifically, the second plate 20 may serve to support the intermediate guide plate 60 on an upper surface thereof and support the lower guide plate 50 on the lower surface thereof. In this case, the second plate 20 may have an area corresponding to the first plate 10. Therefore, the second plate 20 may support the lower guide plate 50 and the intermediate guide plate 60 in at least a portion of the upper surface thereof and at least a portion of the lower surface thereof.

The lower seating region 25 for seating the lower guide plate 50 may be provided on the lower surface of the second plate 20, and the intermediate seating region 26 for seating the intermediate guide plate 60 may be provided on the upper surface thereof.

The lower guide plate 50 may be provided in the lower seating region 25 provided on the lower surface of the second plate 20, and the intermediate guide plate 60 may be provided in the intermediate seating region 26 provided on the upper surface of the second plate 20. In this case, the lower seating region 25 and the intermediate seating region 26 may be configured as concave recesses in the upper and lower surfaces of the second plate 20. However, since this is illustrated as an example, the shapes of the lower seating region 25 and the intermediate seating region 26 are not limited thereto.

The lower seating region 25 and the intermediate seating region 26 may be provided at positions that are inverted from each other with respect to the center of the second plate 20. Therefore, the lower guide plate 50 and the intermediate guide plate 60 may also be provided at positions that are inverted from each other with respect to the center of the second plate 20. However, since the inverted shapes of the lower seating region 25 and the intermediate seating region 26 are illustrated as an example, the shapes of the lower seating region 25 and the intermediate seating region 26 are not limited thereto.

The second plate 20 may include a second through-hole 21 corresponding to the first through-hole 11 of the first plate 10. This allows the probes 80 positioned in the first through-hole 11 to be also positioned in the second through-hole 21.

The second through-hole 21 may be formed to have the same inner diameter as the first through-hole 11. However, the sizes of the inner diameters of the first through-hole 11 and the second through-hole 21 are not limited. For example, the second through-hole 21 may be formed at a position corresponding to the first through-hole 11 to have an inner diameter smaller than that of the first through-hole 11 and capable of securing a free space that allows, when the plurality of probes 80 positioned in the first through-hole 11 is elastically deformed, the elastic deformation to be received therein. Alternatively, the second through-hole 21 may be formed at a position corresponding to the first through-hole 11 to have an inner diameter larger than that of the first through-hole 11.

The plurality of probes 80 may be inserted into and through the upper guide hole 43 of the upper guide plate 40 and inserted into and through a lower guide hole 53 of the lower guide plate 50 through an intermediate guide hole 63, so that the plurality of probes 80 may be positioned inside the first and second through-holes 11 and 12. Therefore, the probe head 1 may have a structure with the first through-hole 11 formed in the first plate 10 and the second through-hole 11 formed in the second plate 20 correspondingly to the first through-hole 11, so that the plurality of probes 80 is positioned inside the first and second through-holes 11 and 21.

At least one of the upper guide plate, 40, the lower guide plate 50, and the intermediate guide plate 60 may be made of an anodic oxide film 101. Therefore, the space transformer ST constituting the present disclosure, and the upper guide plate 40 the lower guide plate 50, and the intermediate guide plate 60 defining substantial probing areas by having the guide holes GH into which the plurality of probes 80 are inserted may be made of the same anodic oxide film 101.

The probe card 100 may perform an electronic die sorting (EDS) process for testing electrical characteristics of each chip constituting a wafer. The EDS process may be performed under a high temperature environment. Therefore, as the overall temperature of the probe card 100 increases, the upper guide plate 40, the lower guide plate 50, and the intermediate guide plate 60 may be thermally expanded. In this case, when at least one of the upper guide plate, 40, the lower guide plate 50, and the intermediate guide plate 60 may be made of the anodic oxide film 101, such deformation may not easily occur.

Each of the upper guide plate, 40, the lower guide plate 50, and the intermediate guide plate 60 may be made of a transparent anodic oxide film 101, so that a problem of reducing positional accuracy of the upper guide hole 43, the lower guide hole 53, and the intermediate guide hole 63 may be prevented.

The upper guide plate 40, the lower guide plate 50, and the intermediate guide plate 60 made of the anodic oxide film 101 may undergo an etching process to form the upper guide hole 43, the lower guide hole 53, and the intermediate guide hole 63. In the case of the anodic oxide film 101, the upper guide hole 43, the lower guide hole 53, and the intermediate guide hole 63 may be vertically formed by the etching process. This may make it possible to implement a fine size and fine pitch of the upper guide hole 43, the lower guide hole 53, and the intermediate guide hole 63.

In the probe card 100 according to the present disclosure, since the space transformer ST having the respective probe connection pads 130, and the upper guide plate 40, the lower guide plate 50, and the intermediate guide plate 60 provided below the space transformer ST and having the probes 80 therein may be made of the same anodic oxide film 101, a problem in which the probe connection pads 130 and the probes 80 coming into contact with the probe connection pads 130 are misaligned due to thermal deformation may be prevented. As a result, probing reliability of the vertical type probe card 100, which is overdriven to test electrical characteristics of a wafer, may be increased.

The reinforcing plate 70 and RP may be provided on at least one surface of each of the upper guide plate 40, the lower guide plate 50, and the intermediate guide plate 60. In the present disclosure, as illustrated in FIGS. 1 to 3, as an example, the reinforcing plate RP may be provided on each of lower surfaces of the upper guide plate 40 and the intermediate guide plate 60 and an upper surface of the lower guide plate 50. This may increase mechanical strength of the upper guide plate 40, the lower guide plate 50, and the intermediate guide plate 60.

When the reinforcing plate RP is provided on at least the surface of each of the upper guide plate 40, the lower guide plate 50, and the intermediate guide plate 60, the reinforcing plate RP may be composed of the upper reinforcing plate 710 coupled to the surface of the upper guide plate 40, the lower reinforcing plate 720 coupled to the surface of the lower guide plate 50, and the intermediate reinforcing plate 730 coupled to the surface of the intermediate guide plate 60.

Therefore, the upper guide plate 40 may include an upper guide pin insertion hole 41 for allowing alignment of the upper guide plate 40 with the upper reinforcing plate 710 provided on the surface of the upper guide plate 40, by means of a guide pin. In addition, the upper guide plate 40 may include an upper main bolt fastening hole 42 for allowing insertion of a coupling means for coupling the upper reinforcing plate 710 and the first plate 10.

Since the lower guide plate 50 and the intermediate guide plate 60 may have a shape corresponding to the upper guide plate 40, each of the lower guide plate 50 and the intermediate guide plate 60 may have a guide pin insertion hole and a main bolt fastening hole that perform the same function in the same shape at the same position as those of the upper guide plate 40.

The reinforcing plate 70 and RP may serve to support the upper guide plate 40, the lower guide plate 50, and the intermediate guide plate 60, and thus may be made of a material having high mechanical strength. Specifically, for example, the reinforcing plate RP may be made of a $Si_3N_4$ material. In another example, the reinforcing plate RP may be made of a ceramic material.

The reinforcing plate RP, the upper guide plate 40, the lower guide plate 50, and the intermediate guide plate 60 may be coupled to each other by bonding or molding.

With such a structure, the present disclosure may have an advantage in terms of mechanical strength while implementing a fine size and fine pitch of the upper guide hole 43, the lower guide hole 53, and the intermediate guide hole 63 in the upper guide plate 40, the lower guide plate 50, and the intermediate guide plate 60 each made of the anodic oxide film 101.

The anodic oxide film 101 having a small thickness may be more efficient in forming the upper guide hole 43, the lower guide hole 53, and the intermediate guide hole 63 vertically. In addition, the anodic oxide film 101 may be a material suitable for implementing a fine size and fine pitch of the upper guide hole 43, the lower guide hole 53, and the intermediate guide hole 63. In the probe head 1, by forming a structure in which at least one of the upper guide plate 40, the lower guide plate 50, and the intermediate guide plate 60 is made of the anodic oxide film 101, and the reinforcing plates 710, 720, and 730 are coupled to the surfaces of the upper guide plate 40, the lower guide plate 50, and the intermediate guide plate 60, it may be possible to provide fine probes 80 with a fine pitch arrangement. At the same time, the probe card 100 may have excellent durability in which warpage deformation is prevented.

Figure 4A:
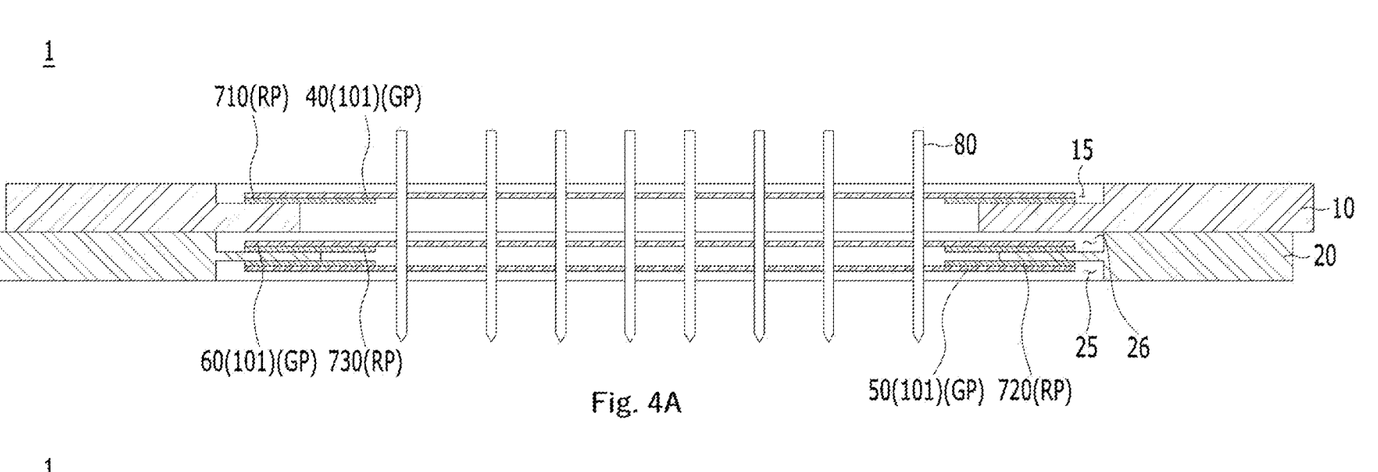
FIGS. 4A and 4B are views illustrating the probe head of FIG. 1.
Figure 4B:
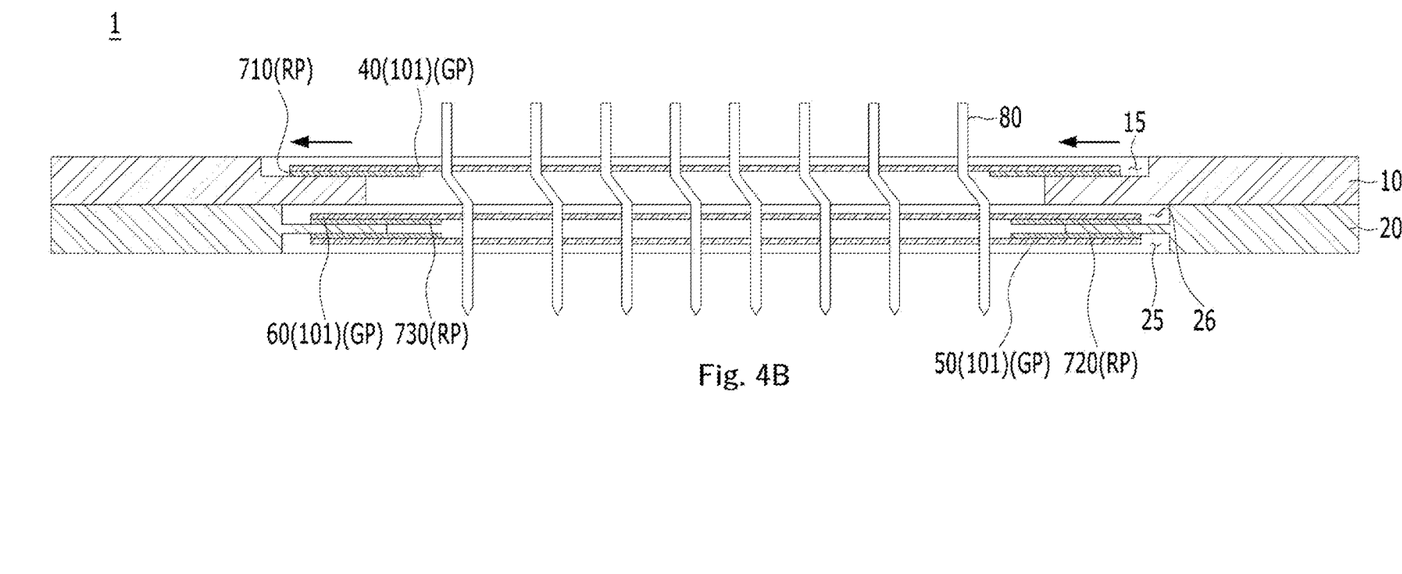

FIGS. 4A and 4B are views illustrating the probe head of FIG. 1. Specifically, FIG. 4A is a view illustrating the probes 80 before undergoing elastic deformation, and FIG. 4B is a view illustrating the probes 80 after undergoing elastic deformation.

Referring to FIGS. 4A and 4B, the probes 80 may vertically pass through the upper guide plate 40, the lower guide plate 50, and the intermediate guide plate 60. In this case, the probes 80 may be provided in a vertical shape without deformation.

Specifically, the probes 80 may pass through the upper guide hole 43 of the upper guide plate 40, then pass through the intermediate guide hole 63 of the intermediate guide plate 60, and finally pass through the lower guide hole 53 of the lower guide plate 50. Therefore, the front ends of the probes 80 may be provided below the second plate 20.

Each of the upper guide plate 40 and the intermediate guide plate 60 may be made of a transparent material. Specifically, the probes 80 may sequentially pass through the upper guide plate 40, the intermediate guide plate 60, and the lower guide plate 50. In this case, a user may more accurately identify the intermediate guide hole 63 and the lower guide hole 53 through the transparent upper guide plate 40 and intermediate guide plate 60. In other words, an effect of facilitating the insertion of the probes 80 may be obtained.

After the probes 80 sequentially pass through the upper guide plate 40, the lower guide plate 50, and the intermediate guide plate 60, the first plate 10 is relatively moved horizontally.

As illustrated in FIG. 4A, when the first plate 10 and the second plate 20 are aligned, the upper guide plate 40, the lower guide plate 50, and the intermediate guide plate 60 may be located on the same vertical line. Therefore, the upper guide hole 43, the lower guide hole 53, and the intermediate guide hole 63 may be located on the same vertical line, and the probes 80 may vertically pass through the upper guide hole 43, the intermediate guide hole 63, and the lower guide hole 53.

When the insertion of the probes 80 is completed, as illustrated in FIG. 4B, the first plate 10 may be moved horizontally (in the direction of the arrow). In this case, the first plate 10 may be moved after the guide pin is removed.

When the first plate 10 is moved to one side, the position of the upper guide hole 43 may be also changed, and the probes 80 may be elastically deformed according to the positional movement of the upper guide hole 43. In other words, upper sides of the probes 80 that have passed through the upper guide hole 43 may be deformed in the moving direction of the first plate 10, and intermediate and lower portions of the probes 80 that have passed through the intermediate guide hole 63 and the lower guide hole 53 may be maintained in a vertical state. Therefore, when the first plate 10 is moved, as illustrated in FIG. 4B, an elastically deformable structure of the probes 80 may be implemented.

FIGS. 5A, 5B, 5C, and 5D are views illustrating a method of manufacturing an intermediate guide plate of FIG. 1. A guide plate GP illustrated in FIGS. 5A, 5B, 5C, and 5D may be at least one of an upper guide plate 40, a lower guide plate 50, and an intermediate guide plate 60, and hereinafter will be described as being the intermediate guide plate 60 as an example. In FIGS. 5A, 5B, 5C, and 5D, for convenience of explanation, a portion of the intermediate guide plate 60 having an intermediate guide hole 63 is enlarged and schematically illustrated.

Figure 5A:
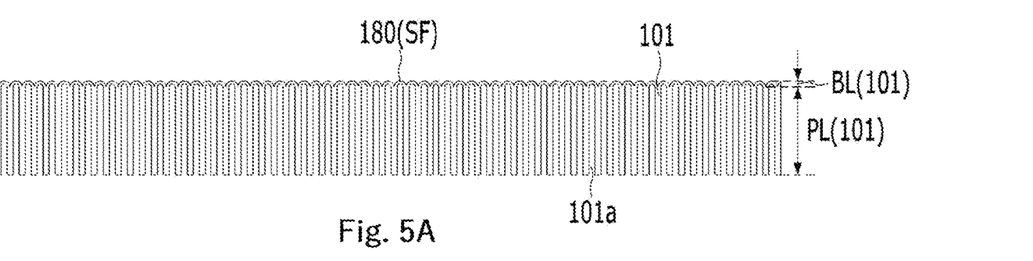
FIGS. 5A, 5B, 5C, and 5D are views illustrating a method of manufacturing an intermediate guide plate of FIG. 1.
Figure 5B:
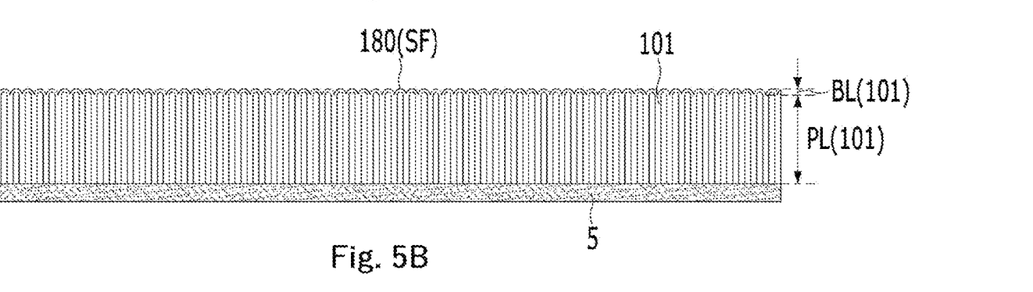

As illustrated in FIG. 5A, an anodic oxide film 101 including pores 101a may be provided. Then, as illustrated in FIG. 5B, a film 5 may be provided under the anodic oxide film 101. In this case, the anodic oxide film 101 may be provided in a state in which a barrier layer BL is not removed, and the barrier layer BL may be provided on an upper surface 180 of the anodic oxide film 101 on which the film 5 is not provided. In other words, a porous layer PL may be provided between the barrier layer BL and the film 5. Since the upper surface 180 of the intermediate guide plate 60 may be composed of the barrier layer BL, a problem in which particles flow into the intermediate guide plate 60 through the pores 101a may be prevented. In addition, inner walls of openings of the guide plate GP, into which front ends of the probes 80 are first inserted during insertion of the probes 80, may be composed of the barrier layer BL having high density, so that high durability may be ensured. This may prevent abrasion of the inner walls of the openings of guide holes GH that may occur simultaneously with the insertion of the probes 80. As a result, a particle generation problem due to abrasion of the inner walls of the openings of the guide holes GH may be minimized.

The film 5 may be a photosensitive material, and preferably, the film 5 is a photosensitive film capable of lithography. In addition, the film 5 may be a material capable of adhesion, and thus, the anodic oxide film 101 and the film 5 may be bonded without use of a separate adhesive means.

Figure 5C:
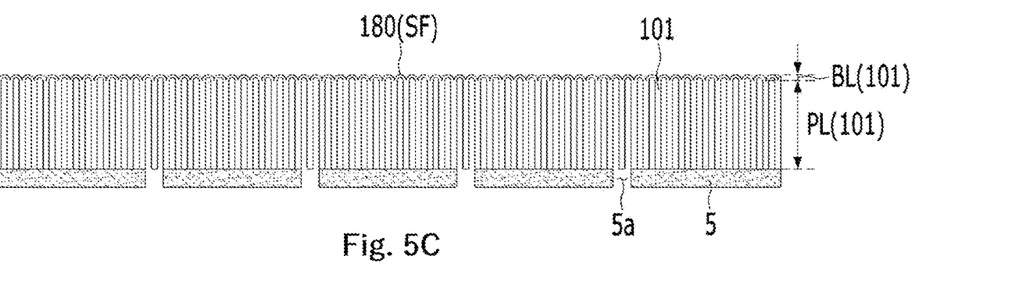

As illustrated in FIG. 5C, at least a portion of the film 5 may be patterned by a photo process. Therefore, a plurality of film holes 5a may be formed in the film 5.

Figure 5D:
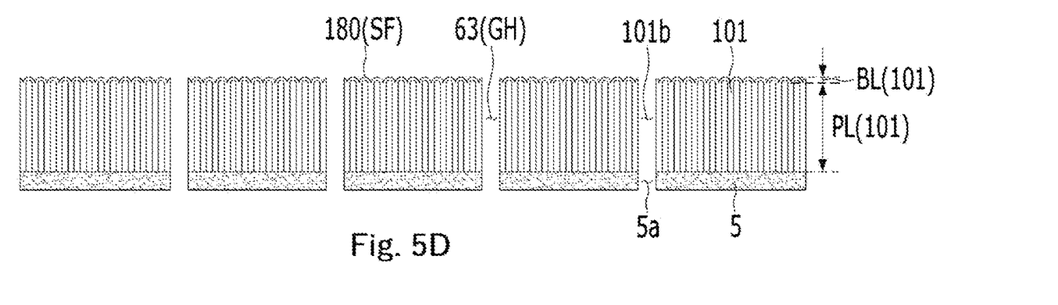

As illustrated in FIG. 5D, the anodic oxide film 101 may be etched through the film holes 5a, which are areas removed by patterning. Therefore, by such etching, a plurality of intermediate guide holes 63 corresponding to the film holes 5a may be formed in the anodic oxide film 101. In other words, the intermediate guide holes 63 may be holes having the same size as the film holes 5a.

The intermediate guide plate 60 in which the intermediate guide holes 63 are formed may be provided on a second plate 20 after the film 5 is removed. However, the intermediate guide plate 60 is not limited thereto, and may be provided on the second plate 20 with the film 5 provided thereon.

In a conventional guide plate, insertion holes for probes are formed by mechanical processing such as laser or drilling processing. Therefore, a residual stress is generated when mechanically processing the insertion holes in the guide plate, resulting in a problem of deteriorating durability during use of the probe card. In addition, since the holes formed by laser or drilling processing are not vertical, it is difficult to insert the probes into the holes. On the contrary, in the intermediate guide plate 60 according to the present disclosure, since the intermediate guide holes 63 are formed by etching, the problems caused by mechanical processing may be prevented, and the intermediate guide holes 63 in which inner walls thereof are vertical in a straight line may be formed. Therefore, the insertion of the probes 80 may be facilitated.

In the present disclosure, only the method of manufacturing the intermediate guide plate 60 has been described, but when each of the upper guide plate 40 and the lower guide plate 50 is made of the anodic oxide film 101, a plurality of upper guide holes 43 and a plurality of lower guide holes 53 may be formed through the same process.

Figure 6:
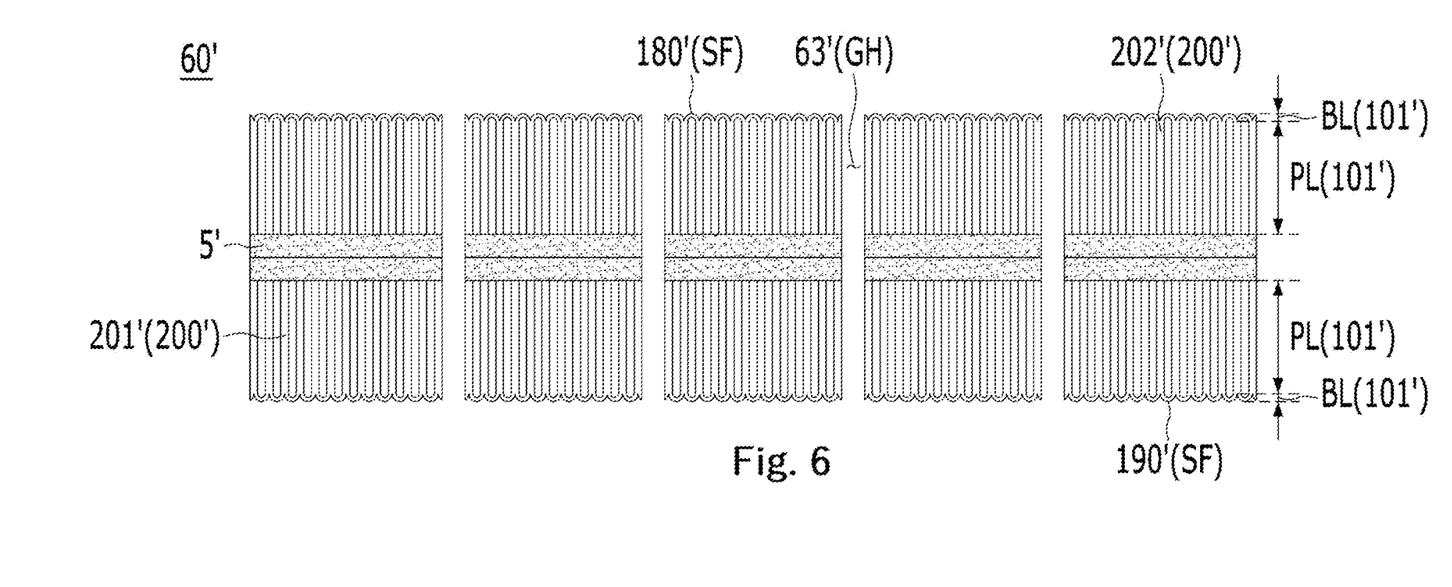
FIG. 6 is a view illustrating a probe head of a probe card according to a second embodiment of the present disclosure.
Figure 7A:
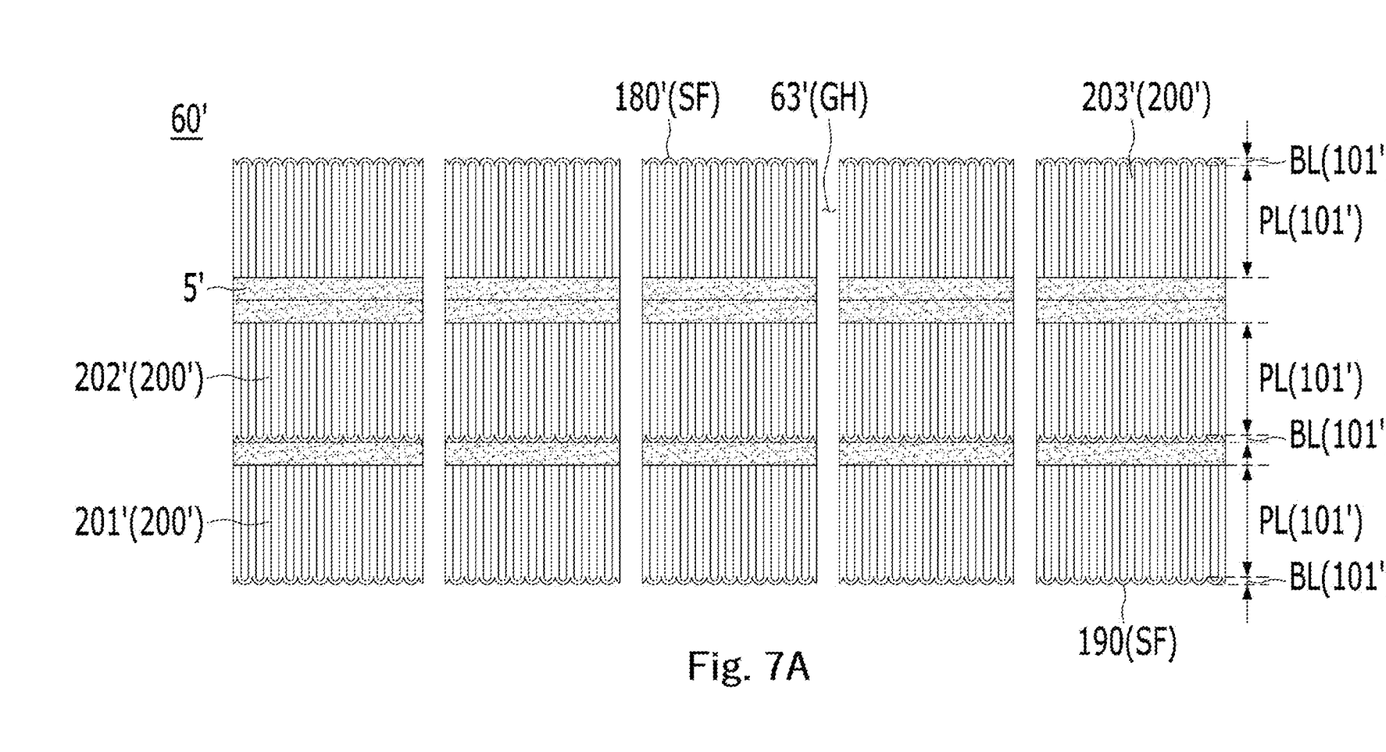
FIGS. 7A and 7B are views each illustrating a modified state of FIG. 6.
Figure 7B:
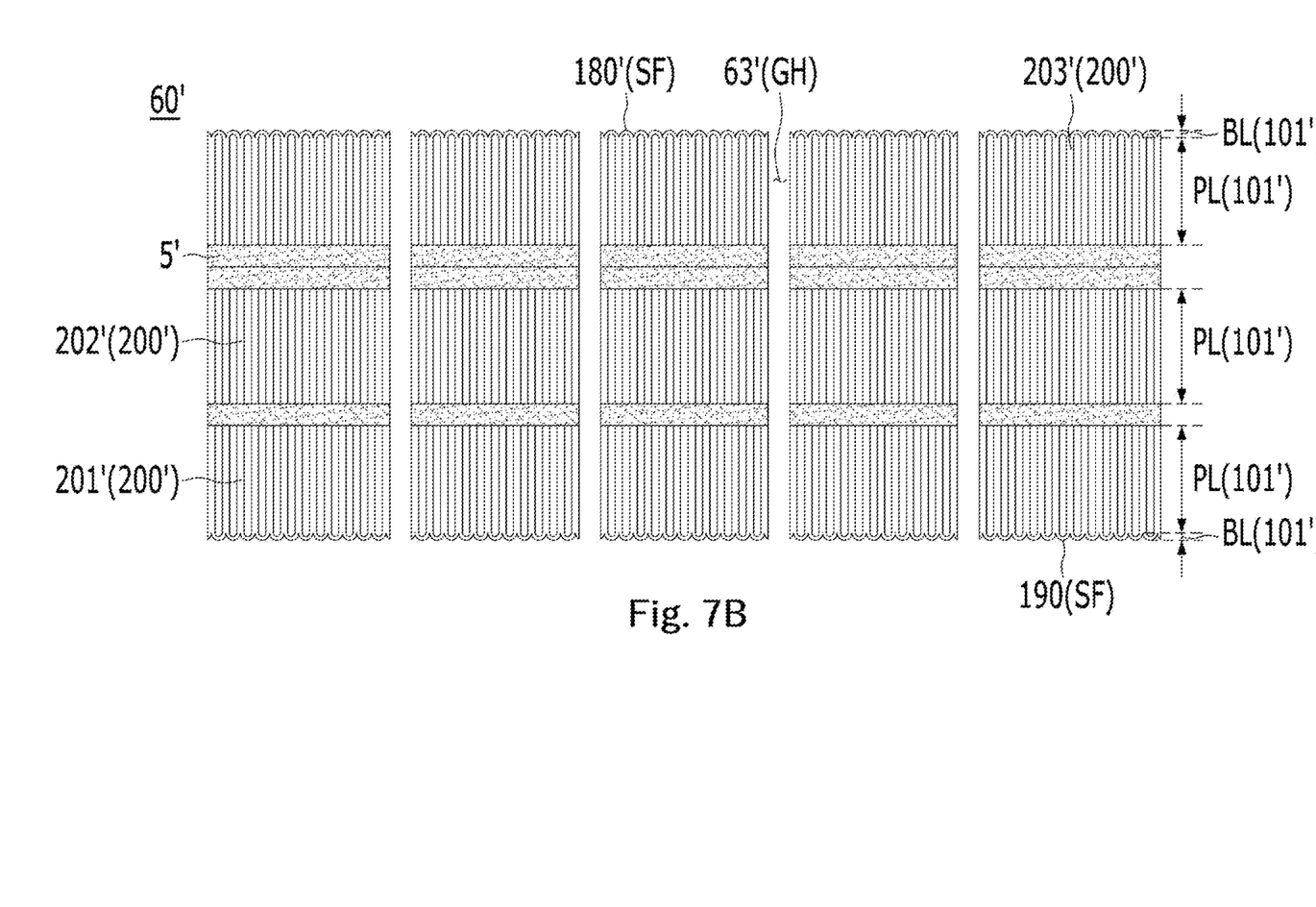

FIG. 6 is a view illustrating a probe head of a probe card according to a second embodiment of the present disclosure, and FIGS. 7A and 7B are views each illustrating a modified state of FIG. 6. Compared to the first embodiment, the second embodiment has a difference in the shape of a guide plate. Therefore, the difference will be mainly described, and the description and reference numerals of the first embodiment will be used for the same parts. A guide plate GP each illustrated in FIGS. 6, 7A, and 7B may be at least one of an upper guide plate 40', a lower guide plate 50', and an intermediate guide plate 60', and hereinafter will be described as being an intermediate guide plate 60' as an example. In FIGS. 6, 7A, and 7B, for convenience of explanation, a portion of the intermediate guide plate 60' having an intermediate guide hole 63' is enlarged and schematically illustrated.

First, FIG. 6 is a view illustrating a stacked structure when the intermediate guide plate 60' is composed of two unit anodic oxide film sheets 200'.

Specifically, in the intermediate guide plate 60', a first unit anodic oxide film sheet 201' and a second unit anodic oxide film sheet 202' may be sequentially stacked.

In the intermediate guide plate 60', the first unit anodic oxide film sheet 201' forming a lower surface 190' may be made of an anodic oxide film 101' having a porous layer PL and a barrier layer BL under the porous layer PL. In addition, in the intermediate guide plate 60', the second unit anodic oxide film sheet 202' forming an upper surface 180' may be made of an anodic oxide film 101' having a porous layer PL and a barrier layer BL on the porous layer PL. In this case, a film 5' may be provided on one side of each of the first unit anodic oxide film sheet 201' and the second unit anodic oxide film sheet 202'. Specifically, the film 5' may be provided at a position not overlapping with the barrier layer BL, and thus, the respective films 5' may be provided on the first unit anodic oxide film sheet 201' and under the second unit anodic oxide film sheet 202'. Therefore, when the first unit anodic oxide film sheet 201' and the second unit anodic oxide film sheet 202' are stacked, the films 5' may be provided between the first unit anodic oxide film sheet 201' and the second unit anodic oxide film sheet 202'.

The first unit anodic oxide film sheet 201' and the second unit anodic oxide film sheet 202' may be bonded to each other by the films 5'. Therefore, the first unit anodic oxide film sheet 201' and the second unit anodic oxide film sheet 202' may be stacked without use of a separate adhesive means.

As illustrated in FIG. 6, the intermediate guide plate 60' is configured so that a surface SF is composed of the respective barrier layers BL having a symmetrical structure, so that upper and lower surfaces of the intermediate guide plate may have a uniform density. Specifically, there may be a density difference between the barrier layer BL in which no pores exist and the porous layer PL in which orderly arranged pores exist. Therefore, when the intermediate guide plate 60' is configured with only one unit anodic oxide film sheet 200' having an asymmetric structure, warpage deformation may occur under a high temperature environment. In addition, a plurality of intermediate guide hole 63' for allowing insertion of the probes 80 may be formed in the intermediate guide plate 60'. However, when the surface SF of the intermediate guide plate 60' is composed of the respective porous layers PL including the pores, there may be a problem in which fine particles are collected therein, and then discharged when the probes 80 are inserted through the guide holes GH.

Therefore, in the present disclosure, at least one of the upper guide plate 40', the lower guide plate 50', and the intermediate guide plate 60' each having the guide holes GH for the insertion of the probes 80 may be configured by stacking a plurality of unit anodic oxide film sheets 200', and the surface SF may be composed of the barrier layers BL having a symmetrical structure.

This may ensure a uniform density of the upper and lower surfaces 180' and 190' of each of the upper guide plate 40', the lower guide plate 50', and the intermediate guide plate 60', thereby preventing warpage deformation.

FIGS. 7A and 7B are views illustrating a stacked structure when an intermediate guide plate 60' is composed of three unit anodic oxide film sheets 200'.

Specifically, as illustrated in FIGS. 7A and 7B, in the intermediate guide plate 60', a first unit anodic oxide film sheet 201' forming a lower surface 190' may be made of an anodic oxide film 101' having a porous layer PL and a barrier layer BL under the porous layer PL. In addition, a third unit anodic oxide film sheet 203' forming an upper surface 180' may be made of an anodic oxide film 101' having a porous layer PL and a barrier layer BL on the porous layer PL. Then, a second unit anodic oxide film sheet 202' including a barrier layer BL as illustrated in FIG. 7A or a second unit anodic oxide film sheet 202' including a porous layer PL with a barrier layer BL removed as illustrated in FIG. 7B may be provided between the first unit anodic oxide film sheet 201' and the third unit anodic oxide film sheet 203'.

In the present embodiment, the intermediate guide plate 60' has been described as having a two- or three-layered stacked structure, but the structure of the intermediate guide plate 60' is not limited thereto. As an example, the intermediate guide plate 60' may be formed a stacked structure of four or more layers.

Since the intermediate guide plate 60' may have a stacked structure as described above, strength of the intermediate guide plate 60' may be increased. In other words, the intermediate guide plate 60' may effectively support probes 80.

While particular embodiments of the probe head and the probe card having the same according to the present disclosure have been described, it is merely illustrative and is not intended to limit the scope of the present disclosure and should be construed as having widest range based on the spirit of present disclosure. Those of ordinary skill in the art may combine and substitute the disclosed embodiments to perform a particular pattern of shape that has not been noted, but it is also within the scope of the present disclosure. It will be apparent to those of ordinary skill in the art that various changes and modifications may be readily made without departing from the spirit and scope of the present disclosure.

What is claimed is:

1. A probe head of a probe card, the probe head comprising:
an upper guide plate having an upper guide hole;
a lower guide plate having a lower guide hole; and
an intermediate guide plate having an intermediate guide hole and provided between the upper guide plate and the lower guide plate,
wherein each of a plurality of probes sequentially passes through the upper guide hole, the intermediate guide hole, and the lower guide hole by insertion of each of the plurality of probes,
wherein at least one of the upper guide plate, the lower guide plate, and the intermediate guide plate includes a first anodic oxide film, a film provided on the first anodic oxide film, and a second anodic oxide film disposed over the first anodic oxide film, wherein the first anodic oxide film and the second anodic oxide film are bonded to each other by the film, and wherein the first anodic oxide film includes a first barrier layer and first vertical pores, the second anodic oxide film includes a second barrier layer and second vertical pores, and the first and second barrier layers have a symmetrical structure.

2. The probe head of claim 1, wherein the film comprises the same hole as at least one of the upper guide hole, the lower guide hole, and the intermediate guide hole.

3. The probe head of claim 2, wherein the film is a photosensitive film capable of lithography.

4. The probe head of claim 1, wherein the upper guide hole and the lower guide hole are disposed in different horizontal positions to elastically deform a first portion of each of the plurality of probes between the upper guide hole and the intermediate guide hole, and wherein a second portion and a third portion of each of the plurality of probes extend in a vertical direction, the second portion being between the intermediate guide hole and the lower guide hole and the third portion being below the lower guide hole.

5. The probe head of claim 4, wherein each of the upper guide plate and the intermediate guide plate is made of a transparent material.

6. The probe head of claim 1, wherein each of the upper guide plate, the lower guide plate, and the intermediate guide plate includes the first anodic oxide film, the film, and the second anodic oxide film.

7. A probe card, comprising:
a space transformer having a probe connection pad electrically connected to each of a plurality of probes; and
a probe head provided below the space transformer,
wherein the probe head comprises:
an upper guide plate having an upper guide hole;
a lower guide plate having a lower guide hole; and
an intermediate guide plate having an intermediate guide hole and provided between the upper guide plate and the lower guide plate, wherein each of the plurality of probes sequentially passes through the upper guide hole, the intermediate guide hole, and the lower guide hole by insertion of each of the plurality of probes, wherein at least one of the upper guide plate, the lower guide plate, and the intermediate guide plate includes a first anodic oxide film, a film provided on the first anodic oxide film, and a second anodic oxide film disposed over the first anodic oxide film, wherein the first anodic oxide film and the second anodic oxide film are bonded to each other by the film, and wherein the first anodic oxide film includes a first barrier layer and first vertical pores, the second anodic oxide film includes a second barrier layer and second vertical pores, and the first and second barrier layers have a symmetrical structure.

8. A guide plate of a probe card, the guide plate comprising:
a first anodic oxide film, a film provided on the first anodic oxide film, and a second anodic oxide film disposed over the first anodic oxide film, wherein the first anodic oxide film and the second anodic oxide film are bonded to each other by the film, and wherein the first anodic oxide film includes a first barrier layer and first vertical pores, the second anodic oxide film includes a second barrier layer and second vertical pores, and the first and second barrier layers have a symmetrical structure.

* * * * *